(12) United States Patent
Lu et al.

(10) Patent No.: US 11,569,447 B2
(45) Date of Patent: Jan. 31, 2023

(54) METHOD FOR TESTING PERFORMANCE OF THIN-FILM ENCAPSULATION

(71) Applicant: WUHAN CHINA STAR OPTOELECTRONICS SEMICONDUCTOR DISPLAY TECHNOLOGY CO., LTD., Hubei (CN)

(72) Inventors: Rui Lu, Hubei (CN); Cunjun Xia, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 384 days.

(21) Appl. No.: 16/754,158

(22) PCT Filed: Nov. 25, 2019

(86) PCT No.: PCT/CN2019/120469
§ 371 (c)(1),
(2) Date: Apr. 7, 2020

(87) PCT Pub. No.: WO2021/036043
PCT Pub. Date: Mar. 4, 2021

(65) Prior Publication Data
US 2021/0066602 A1    Mar. 4, 2021

(30) Foreign Application Priority Data
Aug. 26, 2019 (CN) .......................... 201910787796.2

(51) Int. Cl.
*H01L 51/00* (2006.01)
*H01L 51/52* (2006.01)
(Continued)

(52) U.S. Cl.
CPC .......... *H01L 51/0031* (2013.01); *H01L 22/10* (2013.01); *H01L 51/5253* (2013.01); *H01L 51/56* (2013.01)

(58) Field of Classification Search
CPC .. H01L 51/0031; H01L 51/5253; H01L 22/10
See application file for complete search history.

(56) References Cited

U.S. PATENT DOCUMENTS

| | | | | |
|---|---|---|---|---|
| 2014/0070827 A1* | 3/2014 | Reese | ..................... | G01N 15/08 324/720 |
| 2016/0056414 A1* | 2/2016 | Harikrishna Mohan | ..................... | H01L 51/0097 428/447 |
| 2016/0254487 A1* | 9/2016 | Harikrishna Mohan | ..................... | B32B 15/04 428/213 |

FOREIGN PATENT DOCUMENTS

| | | |
|---|---|---|
| CN | 102445438 A | 5/2012 |
| CN | 103943788 A | 7/2014 |

(Continued)

*Primary Examiner* — David Vu
*Assistant Examiner* — Brandon C Fox
(74) *Attorney, Agent, or Firm* — PV IP PC; Wei Te Chung; Ude Lu

(57) ABSTRACT

The present invention provides a method for testing performance of thin-film encapsulation. Through different combination designs of film layers, lateral water vapor intrusion paths of various thin films or encapsulation structures are formed, thereby obtaining a means to inspect a lateral water vapor and oxygen barrier capacity of thin films and provide a highly effective inspection means for encapsulation of display panels.

10 Claims, 5 Drawing Sheets

(51) Int. Cl.
*H01L 51/56* (2006.01)
*H01L 21/66* (2006.01)

(56) References Cited

FOREIGN PATENT DOCUMENTS

| | | |
|---|---|---|
| CN | 104465622 A | 3/2015 |
| CN | 106290106 A | 1/2017 |
| CN | 110048015 A | 7/2019 |
| CN | 110470583 A | 11/2019 |
| DE | 10208767 C1 | 7/2003 |

* cited by examiner

METHOD FOR TESTING PERFORMANCE OF THIN-FILM ENCAPSULATION

The application requests priority of Chinese patent application submitted on 2019 Aug. 26 to the National Intellectual Property Administration, application No. 201910787796.2, titled "METHOD FOR TESTING PERFORMANCE OF THIN-FILM ENCAPSULATION", which is incorporated by reference in the present application in its entirety.

FIELD OF INVENTION

The present invention relates to the application technology field, and especially to a method for testing performance of thin-film encapsulation.

BACKGROUND OF INVENTION

With development of display technology, flexible display devices have gained broader applications due to advantages such as light weight, thinness, bendability, wider viewing angles, etc. However, organic light-emitting diode (OLED) materials are very sensitive to water vapor and oxygen, and intrusion of a small amount of water vapor and oxygen will cause rapid attenuation of devices and affect a lifetime of OLEDs. In order to ensure a lifetime of flexible display devices, their encapsulation technology is particularly important.

In order to realize flexible display of OLEDs, thin-film encapsulation (TFE) is generally adopted to achieve protection of OLEDs. A conventional OLED TFE design generally adopts a stacked organic/inorganic film layer structure to achieve a purpose of blocking water vapor and oxygen. Wherein, a main effect of the inorganic film is blocking water vapor and oxygen, and the organic film mainly functions to encapsulates particles and mitigate stress.

Conventional TFE structures can effectively block water vapor and oxygen to a certain degree and ensure a lifetime of OLEDs. However, researches have found that OLED light-emitting materials often retract due to intrusion of water vapor at edges, leading to encapsulation failure. In fact, a non-light-emitting area of an OLED display screen is more prone to failure than a light-emitting area of the OLED display screen, which is mainly due to two reasons: first, because an organic film layer in TFE does not have a water vapor and oxygen barrier capacity, a non-light-emitting area does not have an organic film layer to mitigate stress and encapsulate particles, which makes particles at an edge area prone to cause water vapor intrusion, resulting in failure; second, water vapor and oxygen intrusion at an edge area is lateral, while water vapor and oxygen intrusion at a light-emitting area is vertical, and unsatisfactory film layer adhesion between TFE and an OLED layer may cause lateral water vapor intrusion more easily.

However, conventional technical approaches can only inspect a vertical water vapor and oxygen barrier capacity of thin films, and do not have an effective inspection approach for a lateral water vapor and oxygen barrier capacity of thin films and for a lateral water vapor and oxygen barrier capacity between thin films. In order to ensure effective encapsulation of OLEDs, the vertical water vapor and oxygen barrier capacity of thin films is equally important as the lateral one. Therefore, it is particularly necessary to develop an effective means for inspecting a lateral water vapor and oxygen barrier capacity of thin films and between thin films.

SUMMARY OF INVENTION

The conventional technical approaches can only inspect a vertical water vapor and oxygen barrier capacity of thin films, and do not have an effective inspection approach for a lateral water vapor and oxygen barrier capacity of thin films and for a lateral water vapor and oxygen barrier capacity between thin films.

In order to resolve the above-mentioned problem, an embodiment of the present invention provides a method for testing performance of thin-film encapsulation that includes steps: providing a test cavity; depositing a first film layer at a bottom of the test cavity, and arranging a middle of the first film layer to be empty; depositing a second film layer in the middle of the first film layer, and covering a part of the second film layer on the first film layer, wherein a coating area of the second film layer is less than a coating area of the first film layer, and the second film layer is disposed spacing from a side wall disposed in the test cavity; and obtaining a lateral water vapor and oxygen barrier value of the second film layer by an inspection device, and setting the lateral water vapor and oxygen barrier value as a first value.

Furthermore, after the step of providing a test cavity, including steps: depositing the first film layer at the bottom of the test cavity; and obtaining a vertical water vapor and oxygen barrier value of the first film layer by the inspection device, and setting the vertical water vapor and oxygen barrier value as a second value.

Furthermore, an amount of the second film layer is one.

Furthermore, after the step of providing a test cavity, including steps: depositing the second film layer at the bottom of the test cavity; and obtaining a vertical water vapor and oxygen barrier value of the second film layer by the inspection device, and setting the vertical water vapor and oxygen barrier value as a third value.

Furthermore, after the step of obtaining a vertical water vapor and oxygen barrier value of the second film layer by the inspection device, including: comparing the first value with the second value and the third value, respectively; when determining that the first value is less than both the second value and the third value, it is determined that the second film layer has a lateral water vapor and oxygen barrier capacity, otherwise it is determined that the second film layer does not have a water vapor and oxygen barrier capacity.

Furthermore, an amount of the second film layer is multiple.

Furthermore, after the step of providing a test cavity, including steps: sequentially depositing sub-film layers of the second film layer at the bottom of the test cavity; and obtaining a vertical water vapor and oxygen barrier value of each of the sub-film layers of the second film layer by the inspection device, and setting the vertical water vapor and oxygen barrier value of each of the sub-film layers as a corresponding fourth value.

Furthermore, after the step of obtaining a vertical water vapor and oxygen barrier value of each of the sub-film layers of the second film layer by the inspection device, including: comparing the first value with the second value and the corresponding fourth values, respectively; when determining that the first value is less than all of the second value and the corresponding fourth values, it is determined that the second film layer has a lateral water vapor and oxygen barrier capacity, otherwise it is determined that the second film layer does not have a water vapor and oxygen barrier capacity.

Furthermore, the test cavity includes a flexible carrier, wherein the flexible carrier is disposed above the inspection device and at a bottom of the first film layer; and the side wall disposed around the flexible carrier.

Furthermore, the first film layer and the second film layer are made of a same or different material.

Advantage of the present invention is that by combining thin films, lateral water vapor intrusion paths of various thin films or encapsulation structures are formed, thereby obtaining an effective means to inspect a lateral water vapor and oxygen barrier capacity of thin films to realize inspection of a lateral water vapor and oxygen barrier capacity of thin-film encapsulation structures and provide a highly effective inspection means for encapsulation of display panels.

DETAILED DESCRIPTION OF PREFERRED EMBODIMENTS

The embodiments of the present invention are described in detail hereinafter. Examples of the described embodiments are given in the accompanying drawings. It should be noted that the following embodiments are intended to illustrate and interpret the present invention, and shall not be construed as causing limitations to the present invention. Similarly, the following embodiments are part of the embodiments of the present invention and are not the whole embodiments, and all other embodiments obtained by those skilled in the art without making any inventive efforts are within the scope protected by the present invention.

In description of the present invention, it should be understood that terms that indicates orientation or relation of position such as "center", "longitudinal", "lateral", "length", "width", "thickness", "upper", "lower", "front", "rear", "left", "right", "vertical", "horizontal", "top", "bottom", "interior", "exterior", "clockwise", "counterclockwise" are based on orientation or relation of position accompanying drawings show. They are simply for purpose of description of the present invention and simplifying of description, and does not mean or suggest the devices or components have a specified orientation and constructed and operated in a specified orientation; therefore, it should not be understood as limitation of the present invention.

Furthermore, terms "first" and "second" are used simply for purpose of description and cannot be understood to mean or suggest relative importance or implicitly mean amount of the technical features. Therefore, features with terms "first" and "second" can mean or implicitly include one or more of the features. In description of the present invention, "multiple" means two or more unless otherwise clearly and concretely specified.

Figure 1:
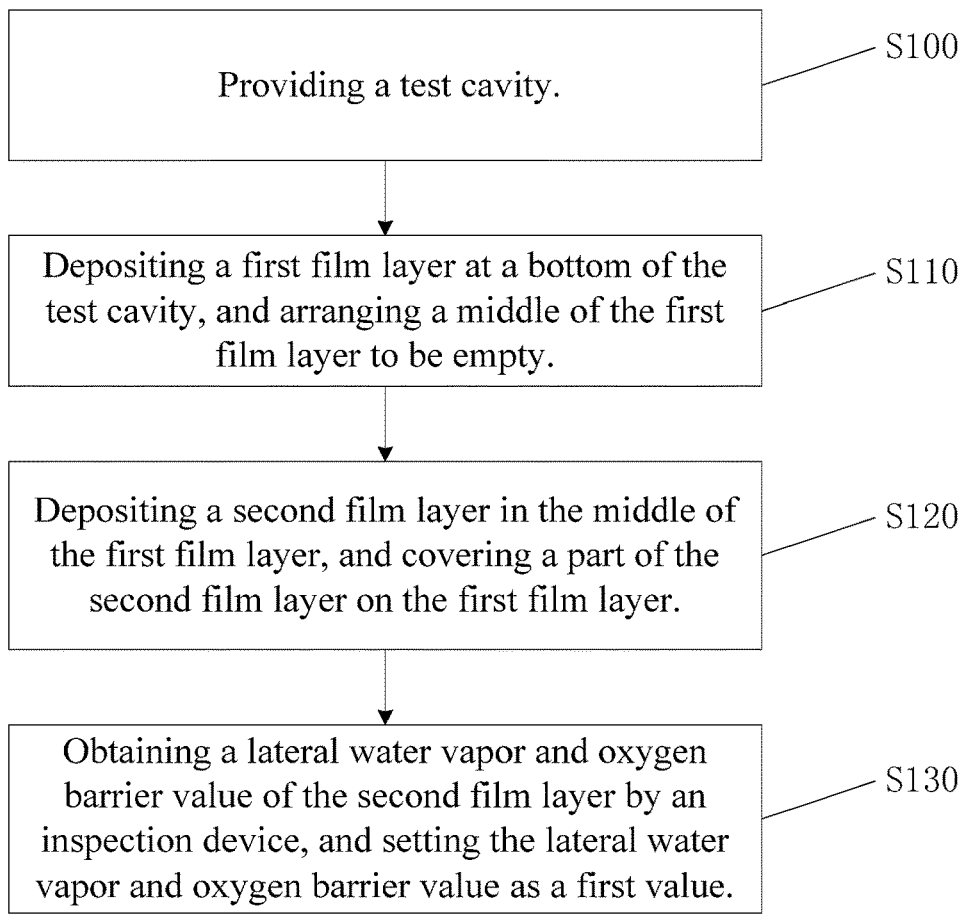
FIG. 1 is a flowchart of a method for testing performance of thin-film encapsulation according to an embodiment of the present invention.
Figure 2:
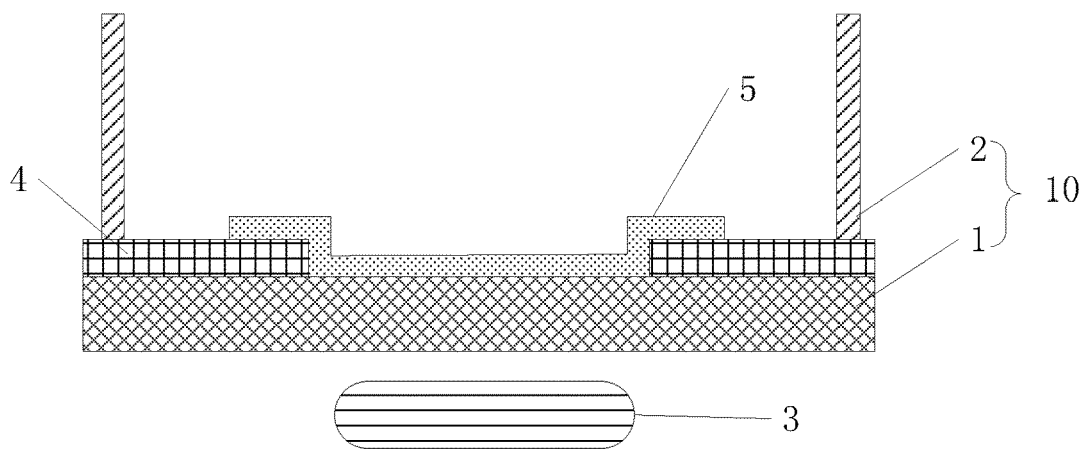
FIG. 2 is a schematic diagram of a structure for testing performance of thin-film encapsulation according to an embodiment of the present invention.

Shown in FIG. 1 is a flowchart of a method for testing performance of thin-film encapsulation according to an embodiment of the present invention. Also referring to FIG. 2, in the present embodiment, a number of a second film layer 5 is one. The method includes following steps.

Figure 11:
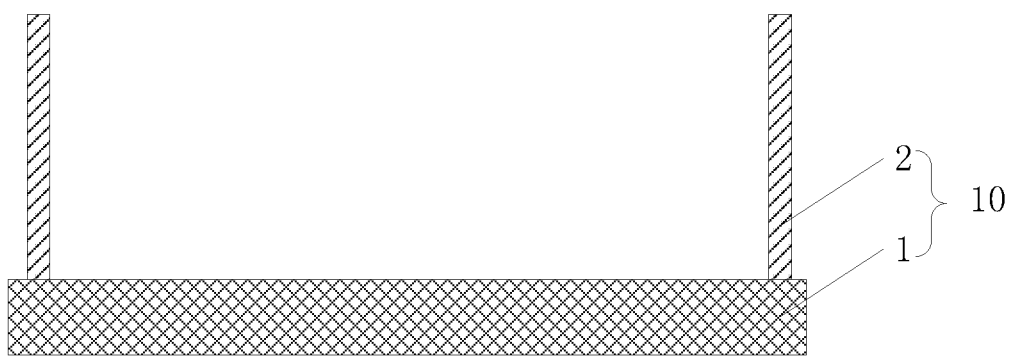
FIG. 11 is a structural schematic diagram of a test cavity according to an embodiment of the present invention.

Also refer to FIG. 11.

Step S100: providing a test cavity 10.

The test cavity 10 includes a flexible carrier 1, wherein the flexible carrier is disposed above an inspection device 3 and at a bottom of a first film layer 4, and a side wall 2 is disposed around the flexible carrier.

The flexible carrier 1 is a flexible polymer, but is not limited thereto, and the flexible carrier 1 does not have a water vapor and oxygen barrier capacity. The side wall 2 is configured to block water vapor and oxygen from outside and secure test thin films. The inspection device 3 is a device for detecting water vapor and oxygen. It can detect a content of water vapor and oxygen, and transform it into a corresponding signal and present a corresponding value. The lower the value is, the better, and a unit of the value is generally g/m2 day.

Step S110: depositing the first film layer 4 at a bottom of the test cavity 10, and arranging a middle of the first film layer 4 to be empty.

The first film layer 4 has a certain water vapor and oxygen barrier capacity, and arranging the middle position of the first film layer 4 to be empty is to reserve a position for arranging a second film layer 5.

Step S120: depositing the second film layer in the middle of the first film layer, and covering a part of the second film layer on the first film layer.

A coating area of the second film layer 5 is smaller than a coating area of the first film layer 4, wherein, the coating area of the second film layer 5 is a projected area of the second film layer 5 on the first film layer 4 (or a projected area on the flexible carrier 1), and the coating area of the first film layer 4 is a projected area of the first film layer 4 on the flexible carrier 1.

The second film layer 5 is disposed spaced apart from the side wall 2 disposed in the test cavity 10, and therefore the second film layer 5 is not connect to the side wall of the test cavity (side wall 2), which exposes side surfaces of the second film layer 5 to air, thereby allowing it to be configured for performing inspection of a lateral water vapor and oxygen barrier capacity.

Step S130: obtaining a lateral water vapor and oxygen barrier value of the second film layer 5 by the inspection device 3, and setting the lateral water vapor and oxygen barrier value as a first value.

The lateral water vapor and oxygen barrier value obtained by the inspection device 3 includes a lateral water vapor and oxygen barrier capacity of the second film layer 5 and a water vapor and oxygen barrier capacity of a gap formed between the second film layer 5 and the first film layer 4.

Figure 3:
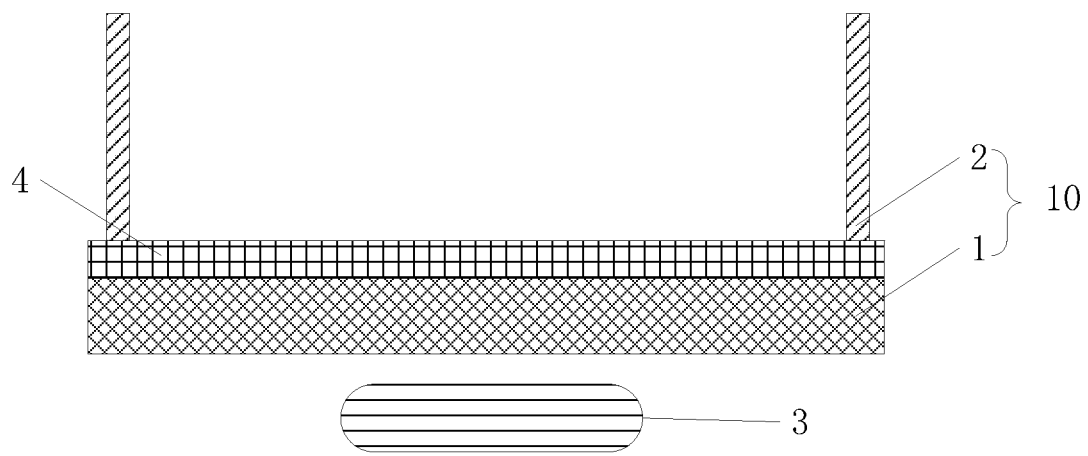
FIG. 3 is a schematic diagram of a structure for testing a first film layer according to an embodiment of the present invention.
Figure 6:
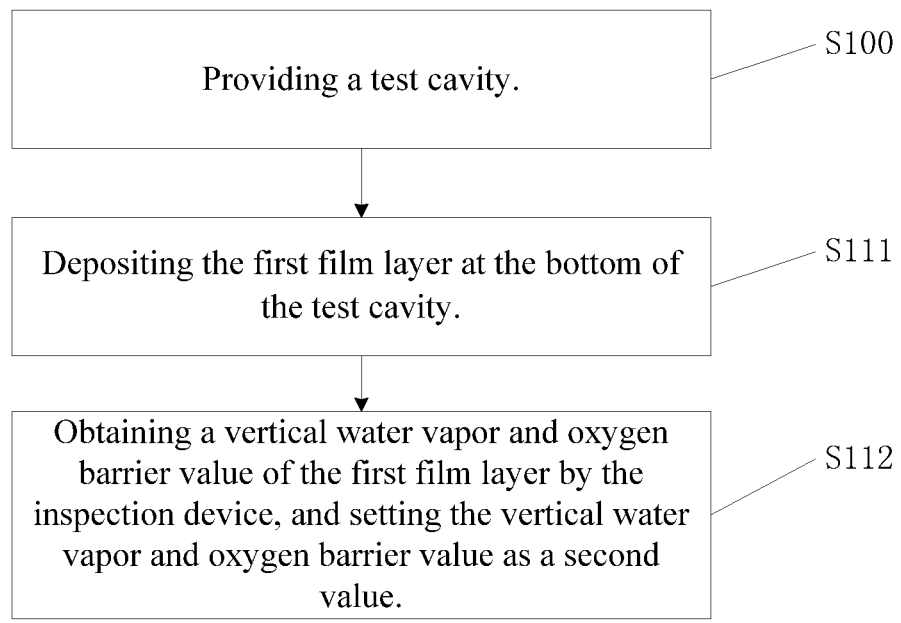
FIG. 6 is a flowchart of testing a first film layer according to an embodiment of the present invention.

As shown in FIG. 6, and also referring to FIG. 3.

Step S111: depositing the first film layer 4 at the bottom of the test cavity 10.

Step S112: obtaining a vertical water vapor and oxygen barrier value of the first film layer 4 by the inspection device 3, and setting the vertical water vapor and oxygen barrier value as a second value.

Through step S111 and step S112, a vertical water vapor and oxygen barrier capacity can be obtained when only a first film layer 4 is disposed in a test cavity.

Figure 4:
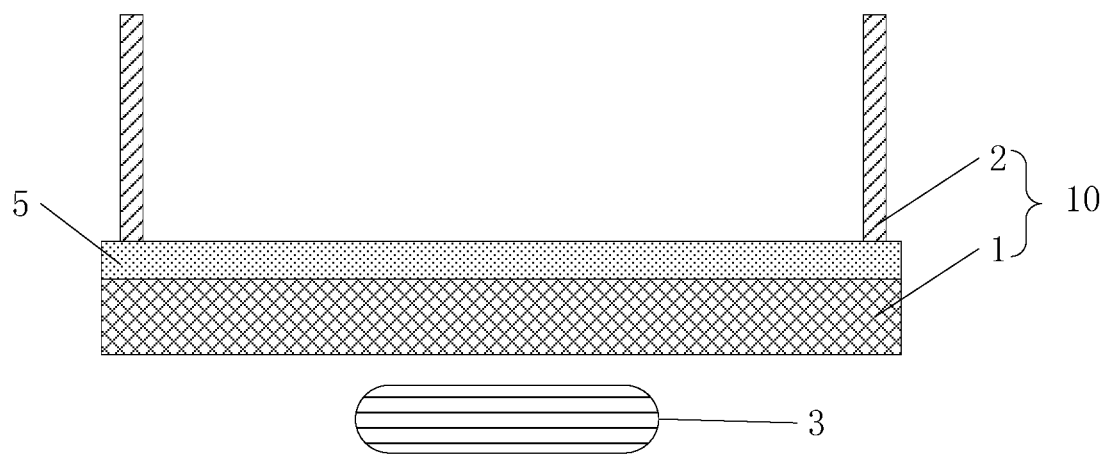
FIG. 4 is a schematic diagram of a structure for testing a second film layer according to an embodiment of the present invention.
Figure 7:
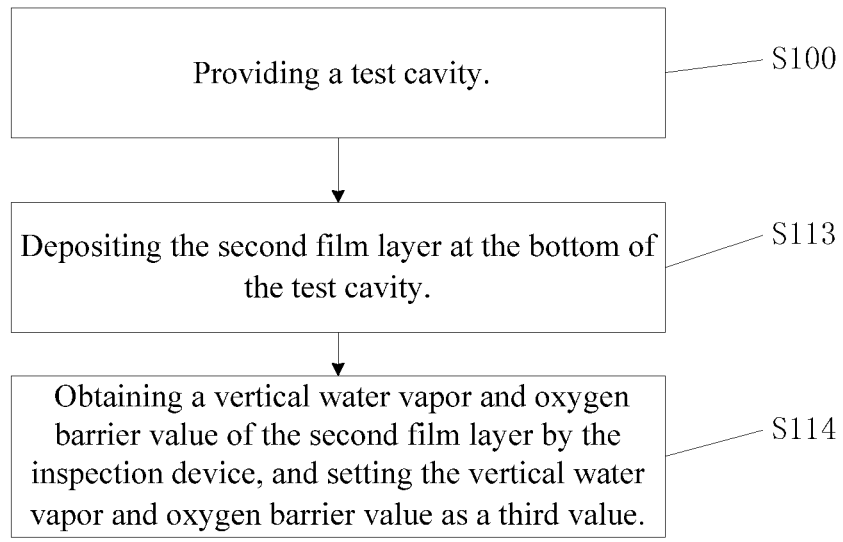
FIG. 7 is a flowchart of testing a second film layer according to an embodiment of the present invention.

As shown in FIG. 7, and also referring to FIG. 4.

Step S113: depositing the second film layer 5 at the bottom of the test cavity 10.

Step S114: obtaining a vertical water vapor and oxygen barrier value of the second film layer 5 by the inspection device 3, and setting the vertical water vapor and oxygen barrier value as a third value.

Through step S113 and step S114, a vertical water vapor and oxygen barrier capacity can be obtained when only a second film layer 5 is disposed in a test cavity.

Wherein, the first film layer 4 and the second film layer 5 can be made of a same or different material.

In an embodiment of the present invention, the first film layer 4 and the second film layer 5 are made of a same material, a number of the second film layer 5 is one, and therefore step S113 and step S114 can be omitted and the second value obtained from step S112 is used directly as the third value.

Figure 9:
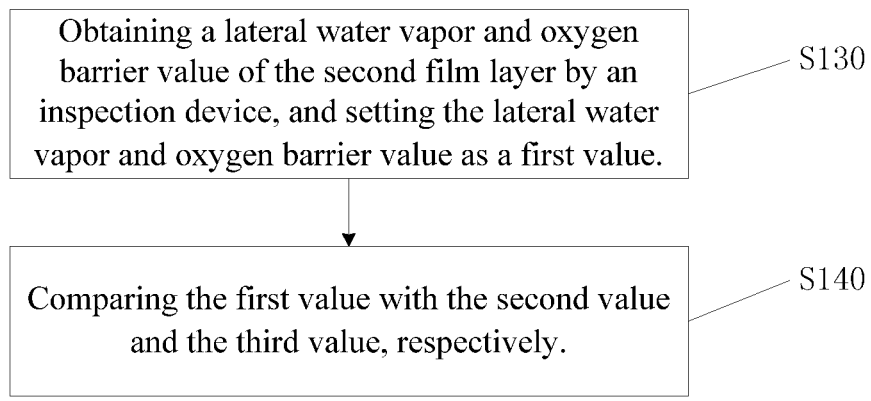
FIG. 9 is a flowchart of a method for testing performance of thin-film encapsulation according to an embodiment of the present invention.

As shown in FIG. 9, step S140: comparing the first value separately with the second value and the third value.

When determining that the first value is less than the second value and the third value, it is determined that the second film layer 5 has a lateral water vapor and oxygen barrier capacity, otherwise it is determined that the second film layer 5 does not have a water vapor and oxygen barrier capacity.

Figure 5:
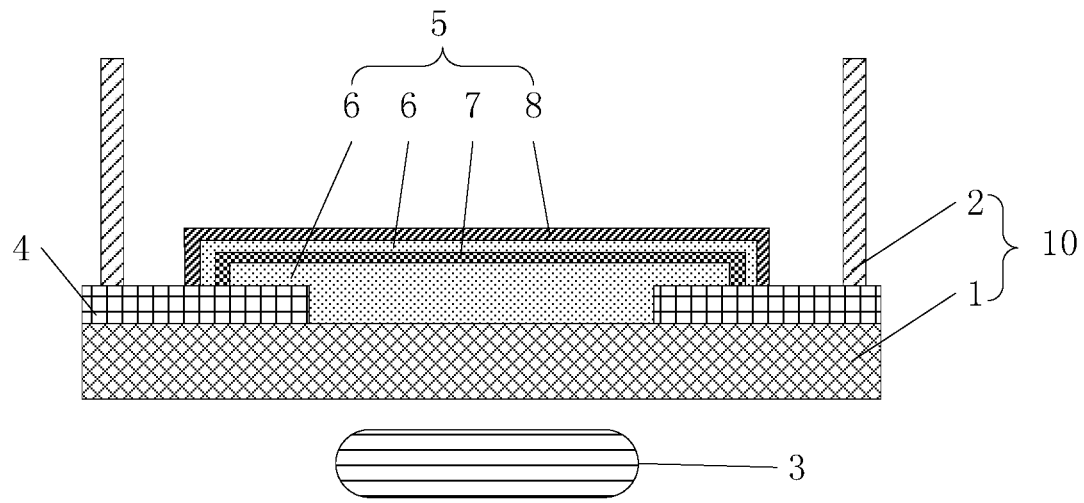
FIG. 5 is a schematic diagram of a structure for testing performance of thin-film encapsulation according to another embodiment of the present invention.

As shown in FIG. 5, and also referring to FIG. 1, in another embodiment, a number of the second film layer 5 is plural, and the plurality of film layers can be same or different.

The second film layer includes two layers of first sub-film layer 6, a second sub-film layer 7, and a third sub-film layer 8, and the plurality of film layers can be same or different.

Step S100: providing a test cavity 10.

The test cavity 10 includes a flexible carrier 1, wherein the flexible carrier 1 is disposed above an inspection device 3 and at a bottom of a first film layer 4, and a side wall 2 disposed around the flexible carrier 1.

The flexible carrier 1 is a flexible polymer, but is not limited thereto, and the flexible carrier 1 does not have a water vapor and oxygen barrier capacity. The side wall 2 is configured to block water vapor and oxygen from outside and secure test thin films. The inspection device 3 is a device for detecting water vapor and oxygen. It can detect a content of water vapor and oxygen, and transform it into a corresponding signal and present a corresponding value. The lower the value is, the better, and a unit of the value is generally g/m2 day.

Step S110: depositing the first film layer 4 at a bottom of the test cavity 10, and arranging a middle of the first film layer 4 to be empty.

The first film layer 4 has a certain water vapor and oxygen barrier capacity, and arranging the middle position of the first film layer 4 to be empty is to reserve a position for arranging a second film layer 5.

Step S120: depositing the second film layer 5 in the middle of the first film layer 4, and covering a part of the second film layer 5 on the first film layer 4.

A coating area of the second film layer 5 is smaller than a coating area of the first film layer 4, wherein, the coating area of the second film layer 5 is a projected area of the second film layer 5 on the first film layer 4 (or a projected area on the flexible carrier 1), and the coating area of the first film layer 4 is a projected area of the first film layer 4 on the flexible carrier 1.

The second film layer 5 is disposed spaced apart from the side wall 2 disposed in the test cavity 10, and therefore the second film layer 5 is not connect to the side wall of the test cavity 10 (side wall 2), which exposes side surfaces of the second film layer 5 to air, thereby allowing it to be configured for performing inspection of a lateral water vapor and oxygen barrier capacity.

As shown in FIG. 6, and also referring to FIG. 3.

Step S111: depositing the first film layer 4 at the bottom of the test cavity 10.

Step S112: obtaining a vertical water vapor and oxygen barrier value of the first film layer 4 by the inspection device 3, and setting the vertical water vapor and oxygen barrier value as a second value.

Through step S111 and step S112, a vertical water vapor and oxygen barrier capacity can be obtained when only a first film layer 4 is disposed in a test cavity.

Figure 8:
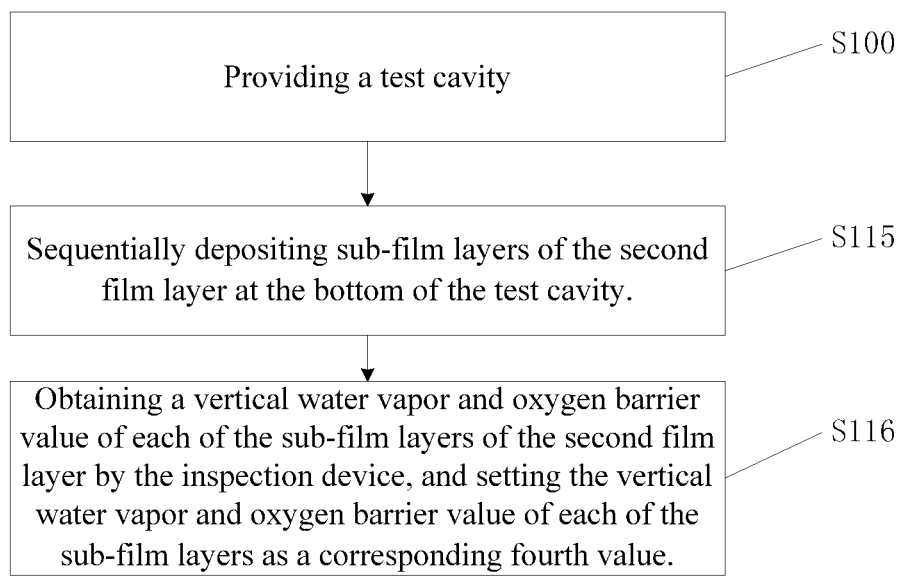
FIG. 8 is a flowchart of testing a second film layer according to another embodiment of the present invention.

As shown in FIG. 8, and also referring to FIG. 5.

Step S115: sequentially depositing sub-film layers of the second film layer 5 at the bottom of the test cavity 10 (including a first sub-film layer 6, a second sub-film layer 7, and a third sub-film layer 8).

Step S116: obtaining a vertical water vapor and oxygen barrier value of each of the sub-film layers of the second film layer 5 by the inspection device, and setting the vertical water vapor and oxygen barrier value of each of the sub-film layers as corresponding fourth values.

Through step S115 and step S116, a vertical water vapor and oxygen barrier value of each film layer in the second film layer 5 can be obtained.

Figure 10:
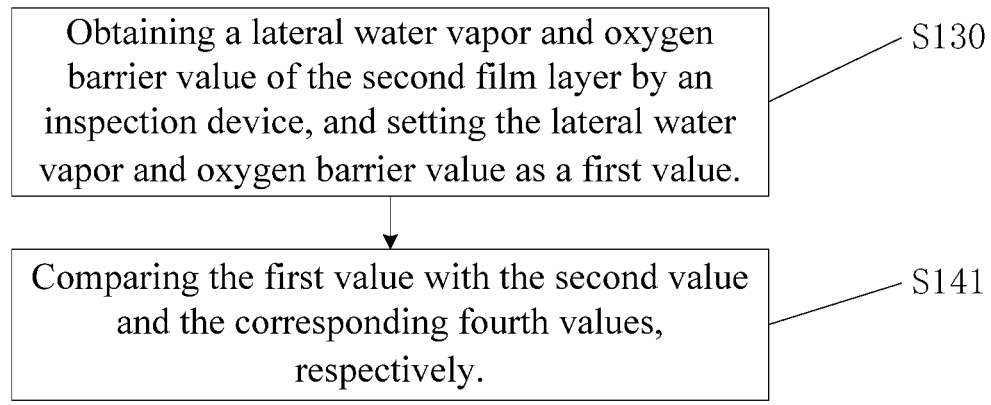
FIG. 10 is a flowchart of a method for testing performance of thin-film encapsulation according to another embodiment of the present invention.

As shown in FIG. 10, step S141: comparing the first value separately with the second value and the corresponding fourth values.

When determining that the first value is less than the second value and the corresponding fourth values, it is determined that the second film layer 5 has a lateral water vapor and oxygen barrier capacity, otherwise it is determined that the second film layer 5 does not have a water vapor and oxygen barrier capacity.

Advantage of the present invention is that by combining thin films, lateral water vapor intrusion paths of various thin films or encapsulation structures are formed, thereby obtaining an effective means to inspect a lateral water vapor and oxygen barrier capacity of thin films to realize inspection of a lateral water vapor and oxygen barrier capacity of thin-film encapsulation structures and provide a highly effective inspection means for encapsulation of display panels.

Although the present invention has been explained in relation to its preferred embodiment, it does not intend to limit the present invention. It is obvious to those skilled in the art having regard to this present invention that other modifications of the exemplary embodiments beyond these embodiments specifically described here may be made without departing from the spirit of the invention. Accordingly, such modifications are considered within the scope of the invention as limited solely by the appended claims.

What is claimed is:

1. A method for testing performance of thin-film encapsulation, comprising following steps:
   providing a test cavity;
   depositing a first film layer at a bottom of the test cavity, and arranging a middle of the first film layer to be empty;
   depositing a second film layer in the middle of the first film layer, and covering a part of the second film layer on the first film layer, wherein a coating area of the second film layer is smaller than a coating area of the first film layer, and the second film layer is disposed spaced apart from a side wall disposed in the test cavity; and
   obtaining a lateral water vapor and oxygen barrier value of the second film layer by an inspection device, and setting the lateral water vapor and oxygen barrier value as a first value.

2. The method for testing performance of thin-film encapsulation as claimed in claim 1, wherein after the step of providing the test cavity, further comprising following steps:
   depositing the first film layer at the bottom of the test cavity; and
   obtaining a vertical water vapor and oxygen barrier value of the first film layer by the inspection device, and setting the vertical water vapor and oxygen barrier value as a second value.

3. The method for testing performance of thin-film encapsulation as claimed in claim 2, wherein a number of the second film layer is one.

4. The method for testing performance of thin-film encapsulation as claimed in claim 3, wherein after the step of providing the test cavity, further comprising following steps:
   depositing the second film layer at the bottom of the test cavity; and
   obtaining a vertical water vapor and oxygen barrier value of the second film layer by the inspection device, and setting the vertical water vapor and oxygen barrier value as a third value.

5. The method for testing performance of thin-film encapsulation as claimed in claim 4, wherein after the step of obtaining the vertical water vapor and oxygen barrier value of the second film layer by the inspection device, further comprising:
   comparing the first value separately with the second value and the third value;
   when determining that the first value is less than the second value and the third value, it is determined that the second film layer has a lateral water vapor and oxygen barrier capacity, otherwise it is determined that the second film layer does not have a water vapor and oxygen barrier capacity.

6. The method for testing performance of thin-film encapsulation as claimed in claim 2, wherein a number of the second film layer is plural.

7. The method for testing performance of thin-film encapsulation as claimed in claim 6, wherein after the step of providing the test cavity, further comprising following steps:
   sequentially depositing sub-film layers of the second film layer at the bottom of the test cavity; and
   obtaining a vertical water vapor and oxygen barrier value of each of the sub-film layers of the second film layer by the inspection device, and setting the vertical water vapor and oxygen barrier value of each of the sub-film layers as corresponding fourth values.

8. The method for testing performance of thin-film encapsulation as claimed in claim 7, wherein after the step of obtaining the vertical water vapor and oxygen barrier value of each of the sub-film layers of the second film layer by the inspection device, further comprising:
   comparing the first value separately with the second value and the corresponding fourth values;
   when determining that the first value is less than the second value and the corresponding fourth values, it is determined that the second film layer has a lateral water vapor and oxygen barrier capacity, otherwise it is determined that the second film layer does not have a water vapor and oxygen barrier capacity.

9. The method for testing performance of thin-film encapsulation as claimed in claim 1, wherein the test cavity comprises:
   a flexible carrier, wherein the flexible carrier is disposed above the inspection device and at a bottom of the first film layer, and the side wall is disposed around the flexible carrier.

10. The method for testing performance of thin-film encapsulation as claimed in claim 1, wherein the first film layer and the second film layer are made of a same material.

* * * * *